(12) United States Patent
Tagano et al.

(10) Patent No.: US 7,715,212 B2
(45) Date of Patent: May 11, 2010

(54) PRINTED BOARD INCLUDING A JOINING PORTION AND A BORE

(75) Inventors: Masahiro Tagano, Yokkaichi (JP); Teruyuki Kitahara, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 405 days.

(21) Appl. No.: 11/902,146

(22) Filed: Sep. 19, 2007

(65) Prior Publication Data

US 2008/0068812 A1 Mar. 20, 2008

(30) Foreign Application Priority Data

Sep. 19, 2006 (JP) .............................. 2006-253314

(51) Int. Cl.
  *H05K 7/14* (2006.01)
(52) U.S. Cl. ...................... 361/807; 361/736; 361/741; 361/756; 361/802; 361/748; 198/345.1
(58) Field of Classification Search ................ 361/736, 361/741, 756, 748, 802, 807; 198/345.1
  See application file for complete search history.

(56) References Cited

U.S. PATENT DOCUMENTS

| | | | | |
|---|---|---|---|---|
| 4,311,265 A | * | 1/1982 | Kondo | .......................... 228/40 |
| 4,540,084 A | * | 9/1985 | Curti | ........................ 198/468.3 |
| 4,610,084 A | * | 9/1986 | Anderson et al. | .............. 29/834 |
| 4,759,488 A | * | 7/1988 | Robinson et al. | ............... 228/43 |
| 5,277,596 A | * | 1/1994 | Dixon | .......................... 439/79 |
| 6,112,885 A | * | 9/2000 | Kuster et al. | ........... 198/867.06 |
| 6,378,857 B1 | * | 4/2002 | Taylor | .......................... 269/47 |
| 6,863,170 B2 | * | 3/2005 | Gordon et al. | ........... 198/345.2 |
| 7,578,046 B2 | * | 8/2009 | Vigil et al. | ..................... 29/564 |
| 2006/0178038 A1 | * | 8/2006 | Eakins et al. | ................ 439/475 |

FOREIGN PATENT DOCUMENTS

| | | |
|---|---|---|
| JP | A 07-094837 | 4/1995 |
| JP | U 3019146 | 12/1995 |
| JP | A 10-126015 | 5/1998 |
| JP | A 10-135585 | 5/1998 |
| JP | A 11-154777 | 6/1999 |

* cited by examiner

*Primary Examiner*—Dameon E Levi
(74) *Attorney, Agent, or Firm*—Oliff & Berridge, PLC

(57) ABSTRACT

A printed board includes a printed board body and throwaway boards provided on opposite sides of the printed board body through joining portions spaced away from each other in a longitudinal direction. Bores are provided in areas bridging the joining portions and throwaway boards. The bores can receive guide pins on a conveying unit for carrying the printed board to an electronic element mounting apparatus. The joining portions and throwaway boards can be removed from the printed board body after mounting the electronic elements on the printed board. This structure can minimize a width of a throwaway board and reduce total costs without lowering mounting efficiency of electronic elements in an electronic element mounting step.

6 Claims, 4 Drawing Sheets

PRINTED BOARD INCLUDING A JOINING PORTION AND A BORE

This application claims priority from Japanese Patent Application No. 2006-253314 filed in the Japanese Patent Office on Sep. 19, 2006, the disclosure of which is incorporated herein by reference in its entirety.

BACKGROUND

Embodiments of the invention relate to a printed board and, more particularly, a printed board having bores to convey the printed board to an electronic element mounting apparatus for mounting electronic elements on the printed board without the need to upsize the printed board.

Generally, during production of a printed board, an electronic element is mounted on the printed board. A conveying unit, for example a belt conveyor, carries the printed board to an electronic element mounting apparatus. The mounting apparatus then positions and fixes the printed board to mount the electronic element on the printed board.

During a conveying operation to move the printed board, opposite sides of the printed board are placed on upper surfaces of opposite side frames of a conveying unit. Holding members of the conveying unit are inserted into through-holes provided in opposite sides of the printed board to carry the printed board. Accordingly, it is impossible to provide a circuit pattern or electronic elements on the portions of the printed board that are placed on the conveying unit. This inability to provide a circuit pattern or electronic elements on the portions of the printed board that are placed on the conveying unit requires a manufacturer to provide additional space on the opposite sides of the printed board for use during conveying. This additional space can increase the size of the printed board.

Consequently, in related art printed boards, joining portions are provided on opposite sides of the printed board. Throwaway boards can be connected to the printed board body through the joining portions. These throwaway boards are then used to mount the printed board to the conveying unit. Specifically, through-holes are provided in the throwaway boards, and after the electronic elements are mounted onto the printed boards, the joining portions and the throwaway boards may be removed from the printed board and scrapped.

JP11-154777A (Patent Document 1) discloses an example of the type of printed wiring board discussed above. FIG. 5 shows a related art printed wiring board 1 including a board body 2 having a wiring pattern on which electronic elements are mounted, a throwaway board 3, and a V-shaped groove 4 for separating the throwaway board 3 from the board body 2. Elongated holes 5 are provided in the side of the throwaway board 3 along a centerline 4a of the groove 4.

In the above structure, since the elongated holes 5 are provided at a side of the throwaway board 3, it is necessary to increase the width of the printed wiring board to account for the elongated holes as well as an area to be clamped by a conveying means. Consequently, the width of the throwaway board will increase. Thus, this increased width of the throwaway board will also result in an increase of wasted material, an increase in cost, and an increase in size of the conveying apparatus itself.

SUMMARY

In view of the above problems, exemplary embodiments of the present invention include a printed board in which through-holes are provided without increasing the size of the printed board including throwaway boards.

In order to overcome the above problems, exemplary embodiments of the present invention include a printed board comprising a printed board body and throwaway boards provided on opposite sides of the printed board body through joining portions spaced away from each other in a longitudinal direction. Through-holes are provided in areas bridging the joining portions and throwaway boards. The through-holes can receive guide pins on a conveying unit for carrying the printed board to an electronic element mounting apparatus. The joining portions and throwaway boards can be removed from the printed board body after mounting the electronic elements on the printed board.

In exemplary embodiments of the present invention, the bores for fixing the printed board serve as positioning holes in the electronic element mounting apparatus and as guiding holes in the conveying means. The bores can be provided not only in the throwaway boards, but in the areas bridging the joining portions and the throwaway boards (the through-holes are provided in only the throwaway board in Patent Document 1). Thus, since the bores are provided in the areas bridging the joining portions and throwaway boards, it is possible to make the width of the throwaway board narrower than that in the Patent Document 1. Furthermore, since the bores can be provided on other areas in addition to the joining portions, it is possible to make the length of each joining portion shorter. Accordingly, it is possible to decrease the size of the whole configuration of the printed board, including the lengths of the joining portions and the widths of the throwaway boards provided on the opposite sides of the printed board. This can minimize wasted portions that are removed after mounting the electronic elements, lower the amount a of materials used during production, and thereby reduce the total cost.

Also, since it is not necessary to provide the bores in the printed board body on which the circuit pattern should be formed, embodiments of the present invention do not influence the arrangement of the circuit pattern, do not require additional space for forming the bores, and can be smaller in size than the related art printed board body.

Also, since portions that come into contact with the conveying means become the throwaway boards, the printed board body is not subject to problems due to contact between the throwaway boards and the conveying means.

Moreover, if at least two bores are provided on a diagonal line of the printed board body, the printed board can be carried stably on the conveying means and can be held in position steady during mounting the electronic elements. If necessary, more than two bores may be provided in the printed board based on, for example, the size of the printed board.

As described above, according to exemplary embodiments, since the bores can be provided on the areas bridging the joining portions and throwaway boards, the bores can be formed in the printed board while minimizing the width of the throwaway boards. Since the bores are not provided on only the joining portions, the joining portions do not increase their lengths and the parts of the joining portions and throwaway boards to be removed are minimized. This can lower the cost of material and reduce the total costs.

Furthermore, since the parts of the joining portions and the throwaway boards that contact the electronic mounting apparatus and the conveying unit are subsequently removed, the finished printed board is not subject to damage and/or problems due to contact between the printed board and the conveying unit.

BRIEF DESCRIPTION OF THE DRAWINGS

Exemplary embodiments will be described with reference to the accompanying drawings, in which like numerals represent like parts, and wherein.

DETAILED DESCRIPTION

Figure 1A:
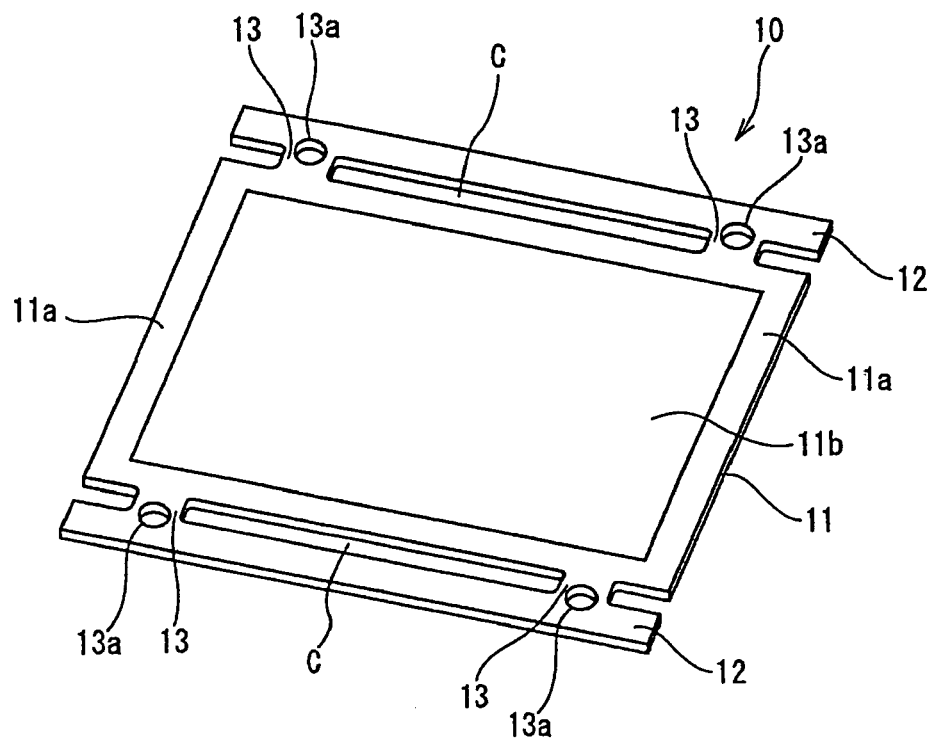
FIG. 1A is a perspective view of an exemplary embodiment of a printed board.
Figure 1B:
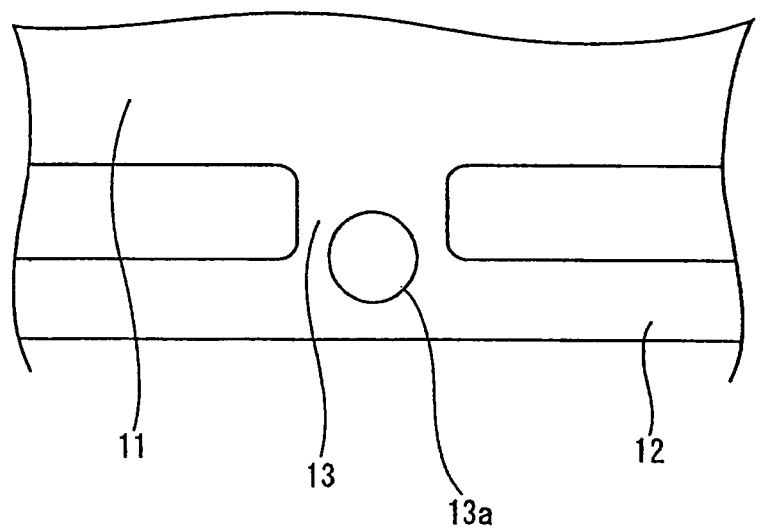
FIG. 1B is plan view of a part of the printed board shown in FIG. 1A.

Referring now to the drawings, an exemplary embodiment of a printed board is described below.

FIGS. 1 to 4 show an exemplary embodiment of a printed board.

In the figures, a printed board 10 includes a printed board body 11, throwaway boards 12 spaced away from the printed board body 11, and joining portions 13 for partially interconnecting the printed board body 11 and the throwaway boards 12.

Figure 2A:
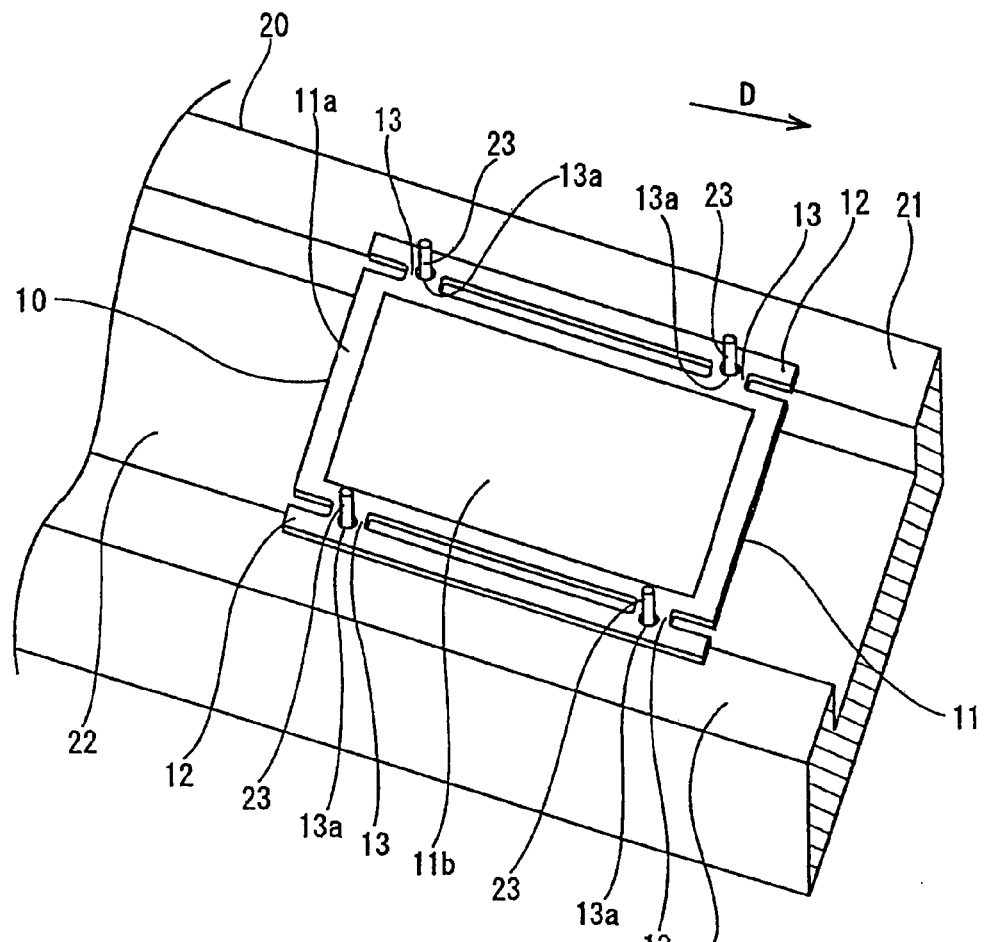
FIG. 2A is a perspective view of an exemplary embodiment of a printed board on a belt conveyor, illustrating an exemplary embodiment of a printed board in a condition before mounting electronic elements on the printed board in an electronic element mounting step.
Figure 3:
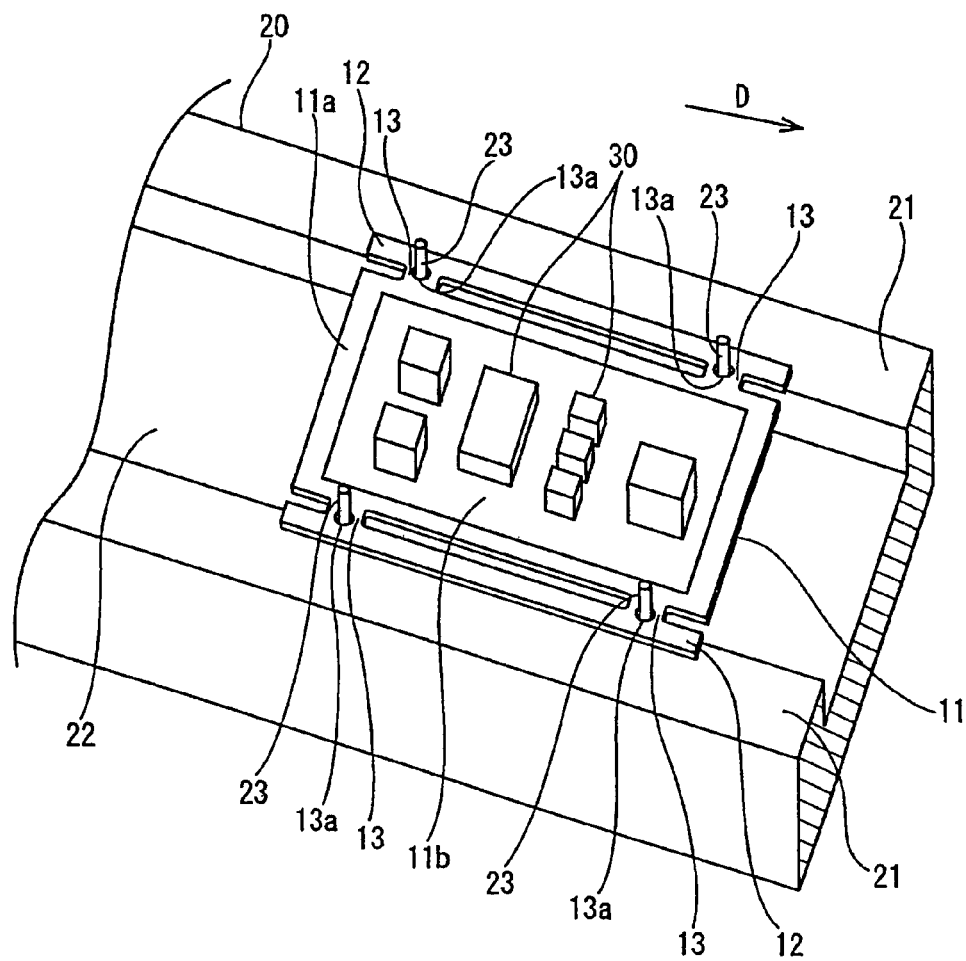
FIG. 3 is a perspective view of an exemplary embodiment of a printed board on the belt conveyor, illustrating an exemplary embodiment of a printed board in a condition after mounting electronic elements on the printed board in an exemplary electronic element mounting step.

As shown in FIG. 2A, the throwaway boards 12 of the printed board 10 are put on and carried by a conveying unit such as a belt conveyor 20 in an exemplary electronic element mounting step. As shown in FIG. 3, electronic elements 30 are mounted on the printed board 10 by an electronic element mounting apparatus (not shown).

Figure 2B:
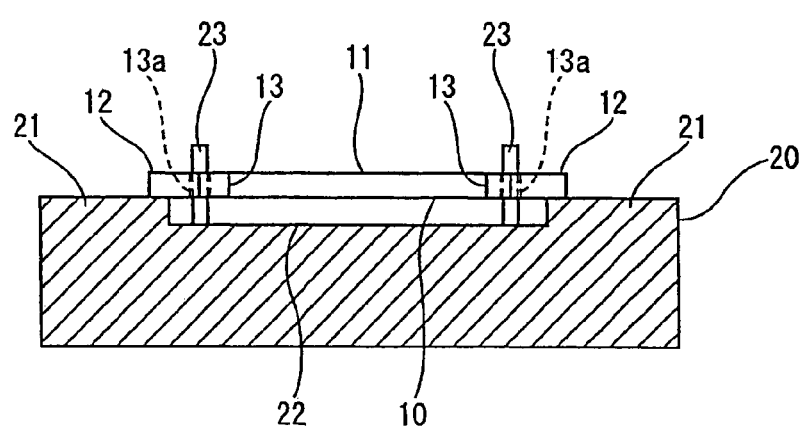
FIG. 2B is a cross section view of FIG. 2A.

As shown in FIGS. 2A and 2B, the belt conveyor 20 can include a pair of supporting portions 21 for supporting the throwaway boards 12, and a recessed portion 22 provided between the supporting portions 21. Four guide pins 23 are provided on the recessed portion 22. Two guide pins 23 may be disposed on each of opposite sides of the recessed portion 22 at a given distance spaced away from each other in a longitudinal direction. While two guide pins are shown disposed on each of opposite sides of the recessed portion, more or less than two guide pins can be used. In addition, the number of guide pins on each side of the recessed portion do not have to be identical. For example, two guide pins can be provided on one side of the recessed portion, while three guide pins can be provided on the other side of the recessed portion.

As shown in FIG. 1A, a given circuit pattern 11b is printed on an insulation board 11a of the printed board body 11. As shown in FIG. 3, the electronic elements 30 are mounted on given positions on the circuit pattern 11b in an exemplary electronic element mounting step.

A width of the printed board body 11 in a direction perpendicular to a traveling direction D (shown in FIG. 3) of the belt conveyor 20 can be set to be smaller than a distance between the opposed guide pins 23.

The joining portions 13 are arranged on the printed board 10 at positions corresponding to the positions on which the guide pins 23 of the belt conveyor 20 are provided. The joining portions 13 partially interconnect and integrate the printed board body 11 and the throwaway boards 12.

Bores or apertures, hereinafter referred to as through-holes 13a are provided on areas extending from, for example, central parts of the joining portions 13 to the throwaway boards 12, or areas bridging the joining portions 13 and throwaway boards 12. As shown in FIGS. 2A and 2B, the through-holes 13a are arranged in the joining portions 13 and the throwaway boards 12 so that the guide pins 23 can enter the through-holes 13a when the throwaway boards 12 are put on the supporting portions or shoulders 21 of the opposed side walls of the recessed portion 22. That is, inner side portions of the throwaway boards 12 toward the joining portions 13 can be disposed above the recessed portion 22 while outer side portions of the throwaway boards 12 spaced away from the joining portions 13 can be disposed on upper surfaces of the supporting portions or shoulders 21 of the recessed portion 22.

A width of each joining portion 13 in the traveling direction D of the belt conveyor 20 is set so that the through-hole 13a can be formed in the joining portion 13.

The joining portions 13 are removed from the printed board body 11 together with the throwaway boards 12 by a cutting unit (not shown), after the electronic elements 30 are mounted on the printed board body 11.

As described above, the throwaway boards 12 are connected through the joining portions 13 to the first and second side outer edges of the printed board body 11. Consequently, clearances C (FIG. 1A) are defined between the printed board body 11 and the throwaway boards 12 at the positions on which the joining portions 13 are not provided. A width of the clearance C corresponds to a length of the joining portion 13 (in a direction perpendicular to the traveling direction D of the belt conveyor 20). A circuit pattern is not provided on the throwaway boards 12.

Next, an exemplary step of mounting electronic elements 30 onto the printed board 10 will be described below.

FIGS. 2A and 2B show the printed board 10 disposed on the belt conveyor 20. The guide pins 23 on the belt conveyor 20 are inserted into the through-holes 13a provided in the joining portions 13 that bridge the printed board body 11 and the throwaway boards 12, so that the printed board 10 is positioned and held on the belt conveyor 20. In this condition, the printed board body 11 does not come into contact with the belt conveyor 20 and only the outer parts of the throwaway boards 12 contact the supporting portions 21 of the belt conveyor 20 during movement of the conveyor.

Figure 4:
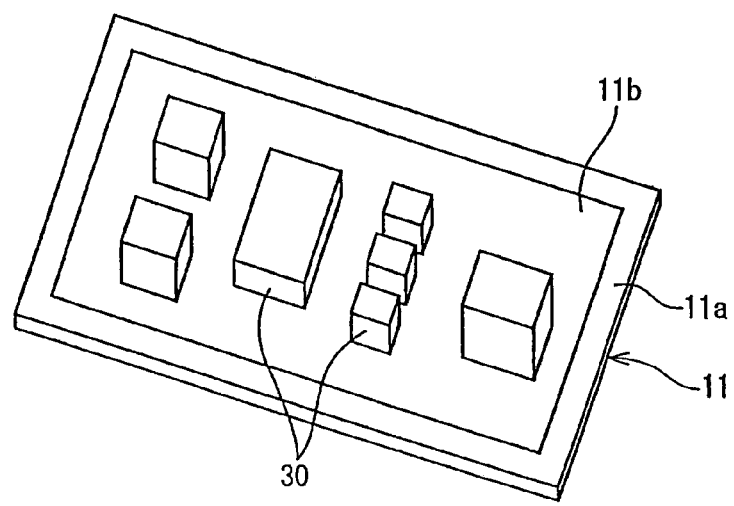
FIG. 4 is a perspective view of an exemplary embodiment of a printed board, illustrating an exemplary embodiment of a printed board in a completed condition.
Figure 5:
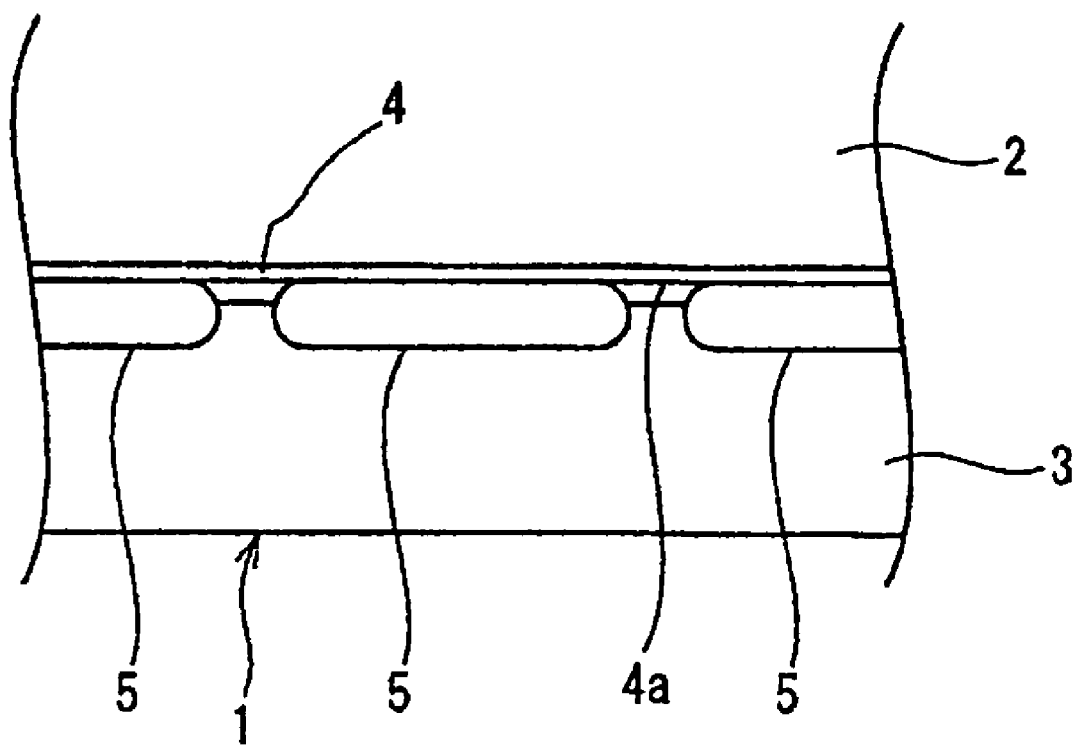
FIG. 5 is a plan view of a part of a related art printed wiring board.

Then, the printed board 10 is carried into an electronic element mounting apparatus by the belt conveyor 20. As shown in FIG. 3, various kinds of electronic elements 30 are mounted on the printed board body 11. Then, the printed board 10 is subjected to a joining step, such as a flow soldering step, to finish the mounting step of electronic elements 30. Thereafter, as shown in FIG. 4, the throwaway boards 12 and joining portions 13 are removed from the printed board body 11 by a cutting unit to complete the printed board body 11 on which the electronic elements 30 are mounted.

As described above, since the through-holes 13a are provided in the areas bridging the joining portions 13 and throwaway boards 12, it is not necessary to increase the width of the throwaway board 12 to provide the through-hole 13a. This minimizes the width of the throwaway board 12 and consequently lowers the amount of material used, thereby reducing total costs. Also, since the joining portions 13 and throwaway boards 12 that come into contact with the belt conveyor 20 are removed, the finished printed board body 11 is less likely to be damaged during conveying, thereby decreasing the likelihood that there will be problems with the printed board due to damages during conveying.

While the invention has been described in conjunction with a specific embodiment, this embodiment should be viewed as illustrative and not limiting. Various changes, substitutes, improvements or the like are possible within the spirit and scope of the invention.

For example, the number of through-holes 13a and the number of joining portions 13 is not limited to the four depicted in FIGS. 1-4, but may be any number, including one.

As another example, the location of the through-holes 13a in the joining portions 13 is not limited to the located shown in FIGS. 1-4.

Additionally, the through-holes 13a can be of any shape, such as square shaped, rectangular, oval shaped, triangular or the like. In addition, the throwaway boards 12 and the printed board body can vary in shape from that shown in FIGS. 1-4.

Additionally, while the through-holes in the exemplary embodiment extend through the joining portion and/or the throwaway board, an aperture or a bore can be used that does not extend through the joining portion and/or the throwaway board, and/or only partially extends through the joining portion and/or the throwaway board.

While the conveying unit described in connection with the exemplary embodiment is a belt conveyor, various other conveyors can be used in conjunction with the printed board.

What is claimed is:

1. A printed board comprising:
   a printed board body; and
   throwaway boards provided on opposite sides of the printed board body; and
   joining portions spaced away from each other in a longitudinal direction, the throwaway boards being joined to the printed board body by the joining portions,
   wherein a bore is provided in an area bridging said joining portions and throwaway boards.

2. The printed board according to claim 1, wherein the bore is provided at a location closer to the throwaway boards than the printed board body.

3. A combination, comprising a printed board and a conveying unit,
   the conveying unit comprising:
      a guide pin;
   the printed board comprising:
      a printed board body including a side edge extending along an extension direction of the conveying unit;
      a throwaway board provided at the side edge; and
      a joining portion that joins the throwaway board and the printed board body so as to create a clearance between the printed board body and the throwaway board, the joining portion including at least part of a bore,
   the bore being positioned such that when the printed board is positioned on the conveying unit, the guide pin is inserted into the bore.

4. The combination according to claim 3, wherein the bore extends from the joining portion to the throwaway board.

5. The combination according to claim 3, wherein the conveying unit further comprises:
   a recess; and
   a shoulder portion,
   wherein the printed board body is placed above the recess and the throwaway board is placed above the shoulder portion.

6. A method of forming a printed board, the printed board comprising a printed board body including a side edge extending along a conveying direction of a conveying unit, the conveying unit including a guide pin; a throwaway board provided at the side edge; and a joining portion that joins the throwaway board and the printed board body, the joining portion including a bore, the method comprising:
   positioning the printed board on the conveying unit such that the guide pin is inserted into the bore;
   positioning electronic elements on a circuit area of the printed board body, the circuit area not contacting the joining portion or the throwaway board; and
   removing the throwaway board.

* * * * *